United States Patent [19]

Kohn

[11] Patent Number: 4,698,654
[45] Date of Patent: Oct. 6, 1987

[54] FIELD EFFECT TRANSISTOR WITH A SUBMICRON VERTICAL STRUCTURE AND ITS PRODUCTION PROCESS

[75] Inventor: Erhard Kohn, Orsay, France

[73] Assignee: Thomson-CSF, Paris, France

[21] Appl. No.: 910,302

[22] Filed: Sep. 22, 1986

Related U.S. Application Data

[63] Continuation of Ser. No. 685,738, Dec. 24, 1984, abandoned.

[30] Foreign Application Priority Data

Dec. 27, 1983 [FR] France .................. 83 20840

[51] Int. Cl.$^4$ .................. H01L 29/80; H01L 29/78; H01L 29/06
[52] U.S. Cl. .................. 357/22; 357/56; 357/23.14
[58] Field of Search .................. 357/22, 56, 22.14

[56] References Cited

U.S. PATENT DOCUMENTS 4,129,879 12/1978 Tantraporn et al. .................. 357/56
4,160,259 7/1979 Nishizawa .................. 357/22
4,262,296 4/1981 Shealy .................. 357/22

FOREIGN PATENT DOCUMENTS 0051504 12/1982 European Pat. Off. .
2230082 12/1974 France .

Primary Examiner—Martin H. Edlow
Assistant Examiner—Robert P. Limanek
Attorney, Agent, or Firm—Oblon, Fisher, Spivak, McClelland & Maier

[57] ABSTRACT

The invention relates to a vertical field effect transistor operating under ballistic conditions at very high frequencies (100–200 GHz). In order to increase the output impedance of this transistor, as well as its power, the field effect of the first gate is decoupled from the drain by the field effect of a second gate. The two gates are carried by two opposite sides of a mesa etched in the active layer beneath the drain. The second gate is displaced with respect to the first gate and is closer to the drain. The displacement is obtained by an insulating layer beneath the second gate. The two gates are successively deposited by lateral projections. Application to ultra-high frequency systems.

6 Claims, 8 Drawing Figures

FIELD EFFECT TRANSISTOR WITH A SUBMICRON VERTICAL STRUCTURE AND ITS PRODUCTION PROCESS

This application is a continuation of application Ser. No. 685,738, filed Dec. 24, 1984, now abandoned.

BACKGROUND OF THE INVENTION

The present invention relates to a field effect transistor with a vertical structure and submicron dimensions, which operates under ballistic or quasi-ballistic conditions. This transistor is intended for ultra-high frequencies up to 100 and 200 GHz; in order to increase its amplification gain and its power, its output impedance is increased by means of a decoupling between the gate to which is applied the ultra-high frequency signal and the drain by a second gate, i.e. it is a tetrode transistor.

The transistor according to the invention is of the metal-semiconductor or metal-insulator-semiconductor types, because in the case of a vertical structure and particularly if it is submicronic, it is not possible to envisage pn junctions between layers of semiconductor materials on the sides of a mesa. It is therefore a metal-semiconductor transistor or MESFET, or a metal-insulator-semiconductor transistor or MISFET, but with a view to simplifying the explanations or drawings, the invention will be described relative to a MESFET.

In the same way, ultra-high frequency transistors, i.e. those operating at frequencies well beyond 1 GHz, are presently made from materials of groups III-V, particularly if they have a submicron gate length. The invention is also applicable to silicon transistors, but a silicon transistor is far from having the ultra-high frequency performance levels of a gallium arsenide transistor and consequently the invention is described relative to the case of a GaAs transistor, although the invention also relates to materials such as GaAlAs, GaInAs, InP, etc.

In a submicron vertical transistor, the output impedance between the source and drain is of low value, because submicron transistors have very small source and drain dimensions. It is consequently not possible to obtain a high impedance through a fine material layer which forms the active layer. In order to increase the available power, the field effect of the gate on the output of the transistor and which is the cause of this low impedance value is interrupted, so as to bring about a better coupling of the gate, representing the transistor input, from the drain. This decoupling is obtained by placing a device between gate and drain which develops a second negative potential zone, which is not modulated because it is connected in current source and controlled by a fixed gate voltage. Thus, this decoupling device is constituted by a sescond gate electrode, which is located between the first transistor gate and the drain. In a vertical structure, the two gates are deposited on the sides of the mesa in which passes the channel. In the case of a submicron structure, said mesa has a height of approximately 0.4 micron and the process according to the invention describes the production of such a transistor, which has two gates, whereof one is displaced relative to the other and is located between the ultra-high frequency gate and the drain.

SUMMARY OF THE INVENTION

More specifically, the present invention relates to a field effect transistor with a submicron vertical structure having a substrate, whereof the first face carries a source electrode metallization and a second face carries a semiconductor material layer called the active layer, which supports a semiconductor material layer called the contact layer and a drain electrode metallization, a mesa being etched beneath the drain in two semiconductor layers and cuts at least partly into the active layer, wherein the length of the conductor channel in the active layer is less than 1 micron and wherein it has two gate electrode metallizations deposited on two opposite sides of the mesa and which are arranged in a displaced manner, the second gate increasing the output impedance of the transistor being closer to the drain than the first control gate.

BRIEF DESCRIPTION OF THE DRAWINGS

The invention is described in greater detail hereinafter relative to a non-limitative embodiment and by the process making it possible to produce the transistor according to the invention, relative to the following drawings, wherein show.

DETAILED DESCRIPTION OF THE INVENTION

Figure 1:
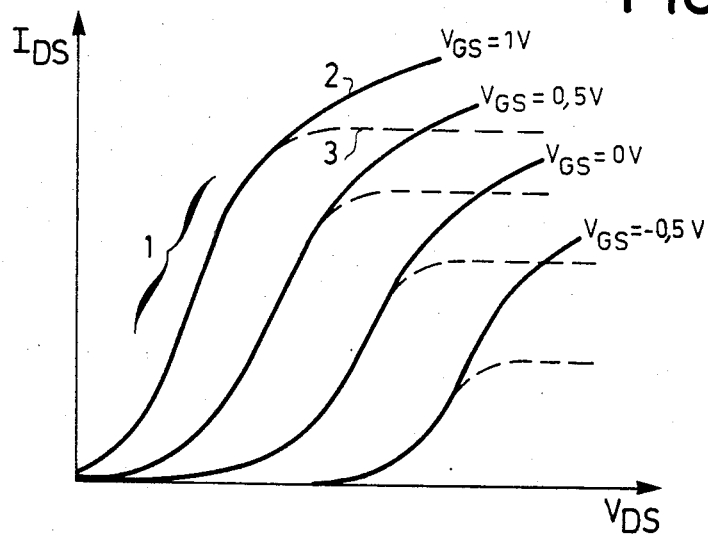
FIG. 1 characteristic curves of the drain current as a function of the drain voltage, for different gate voltages, in a quasi-ballistic field effect transistor.

FIG. 1 shows the characteristic curves of the drain current $I_{GS}$ as a function of the drain voltage $V_{DS}$ for a submicron vertical field effect transistor.

Various curves corresponding to different gate voltages $V_{GS}$ are superimposed on this graph and in a purely explanatory manner positive, zero and negative gate voltages have been chosen. Each of these characteristic curves is constituted by a first or linear part 1, which in the present case increases strongly in intensity when the drain voltage increases slightly, the concavity of this curve being turned towards the ordinate axis. This is the opposite to the shape conventionally encountered with field field-effect transistors, the concavity of the curves generally being turned towards the abscissa axis. This is due to the ballistic or quasi-ballistic operation of the transistor. More specifically, a transistor never functions under purely ballistic conditions, such as exist in a vacuum tube, and instead it functions under quasi-ballistic conditions. Due to the fact that the transistor according to the invention functions under quasi-ballistic conditions, these characteristic curves have a second part 2 with a much more marked slope than that which it is wished to obtain. The desired curve is curve 3 shown in dotted line form, and which corresponds to a high output impedance. It develops virtually parallel to the abscissa axis of the drain voltages, at least in the lower limit at the breakdown voltage of the transistor.

It is in fact important for the purpose of having a certain power, bearing in mind the very small size of the transistors operating at 100 or 200 GHz, that the transistor has an output resistance on its drain, simply because the power is proportional to the output resistance multiplied by the square of the intensity of the current passing through the device. The current is limited because on heating, it aids the diffusion of electrons, with recombination, which reduces the ballistic effect. If the resistance is too low, the available power is low.

Figure 2:
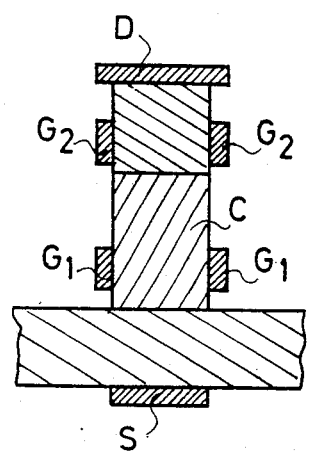
FIG. 2 a block diagram of a vertical field effect transistor, to which is added a field effect transistor connected in a current source.

The solution according to the invention for increasing the output resistance of a submicron field effect transistor is shown in FIG. 2.

If the field effect transistors are vertical, the length of the submicron gate has a low output impedance, which limits the possibilities of stable amplification at high frequencies. However, they offer the possibility of placing a gate on either side of the channel, which makes it possible to obtain a high transconductance gm, and eliminate the effects of injecting current into the substrate and which are encountered in submicron planar structures.

The block diagram of FIG. 2 shows a main field effect transistor which has, apart from a substrate, a source S, a channel C controlled by a gate G1 and a drain D. This main transistor is connected in series with a secondary transistor acting as a current source. This secondary transistor considers that the channel C of the main transistor is its source, the drain D being common to the main and secondary transistors, and a gate G2 makes it possible, e.g. by applying an unmodulated potential, to produce a negative potential zone belonging to the secondary transistor, consequently decouples the modulated depletion zone of the main transistor and the drain D. Therefore the secondary transistor inserted between gate G1 and drain D of the main transistor acts as a current regulator, and as a result of the decoupling effect between G1 and D, it increases the output impedance of the main transistor.

Figure 3:
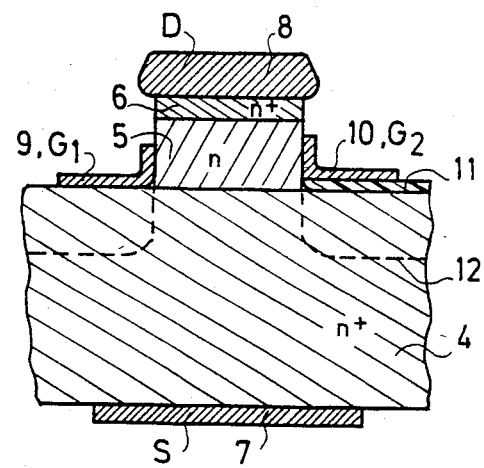
FIG. 3 a section through a vertical field effect transistor according to the invention.

FIG. 3 shows how a transistor according to the invention is obtained. It is obvious that the invention applies to a transistor, whose channel or gate length is submicronic, i.e. the distance between the two source and drain layers is less than approximately 0.4 micron in the case of GaAs.

The transistor according to the invention has a substrate 4, which is made from type n+ material and carries a contact electrode 7. This electrode carried by the substrate is the source electrode because, as it has been stated that the second gate of the transistor must be nearer the drain, a reverse structure with the source on the mesa and the drain on the substrate although envisageable would be difficult to realize. On substrate 4 is deposited a layer 5 of type n doped material, which forms the active layer and in which the conductor channel of said vertical transistor develops. Layer 5 carries a film 6 of type n+ doped material, which forms the heterojunction for injecting hot electrons. This film also provides a good contact for the metallization of metal film 8 forming the transistor drain. Thus, the thickness of layer 5 is approximately 0.4 micron, perpendicular to the drain.

A mesa is formed in layers 6 and 5 and gate electrodes G1 designated 9 and G2 designated 10 are deposited on two opposite sides of said mesa. The displacement between the two electrodes is obtained by depositing the second electrode G2 on an insulant thickness 11. Moreover, the characteristics of the transistor according to the invention are improved if an implanted area 12 is made semiinsulating and is formed in the thickness of the active layer and in part in the substrate around the mesa base.

Figure 4:
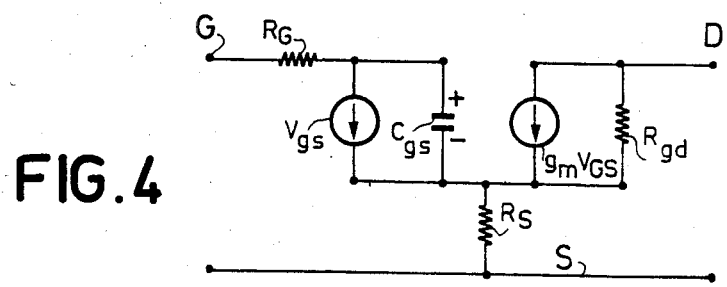
FIG. 4 a simplified equivalent diagram of a vertical field effect transistor (triode).

The operation of a triode transistor is shown in FIG. 4, which provides the simplified equivalent diagram of a vertical field effect transistor.

On this equivalent diagram, gate G constitutes a quadrupole input, whilst the drain constitutes a quadrupole output, the source being common to the quadrupole input and output. The gate has a gate resistance $R_G$, and there is a voltage source $V_{GS}$ between the gate and source, a stray capacitance $C_{gs}$ being positioned parallel with respect to the voltage source. The transistor output, the voltage source is equal to the voltage of $V_{GS}$ multiplied by the transconductance gm and said voltage source is itself parallel to a resistance $R_{gd}$. The low value of the output impedance between the source and the drain is explained by a field effect of the gate. This problem is solved by increasing the decoupling between the gate and the drain, which also improves the stability of the transistor at high frequencies.

This decoupling is obtained by means of a second gate G2 designated 10 in FIG. 3, which is closer to the drain than the first gate G1.

The two gates can be polarized according to two possible configurations, in a first case the two gates are identically polarized by a potential $V_{G2}$, which is a d.c. voltage and the first transistor gate G1 is also polarized by a radiofrequency voltage, because it has been stated that the transistor according to the invention relates to ultra-high frequencies. In this case, the two gates are connected by a metal film, which makes it possible to simultaneously apply the ultra-high frequency signal voltage to the two gates. In a second case, the first gate G1 close to the source is polarized by the radio-frequency signal and the second gate G2 is subject to a static potential $V_{G2}$ and in this case the two gates are not interconnected.

FIGS. 5 to 8 show the different stages in the production of a field effect transistor according to the invention.

Figure 5:
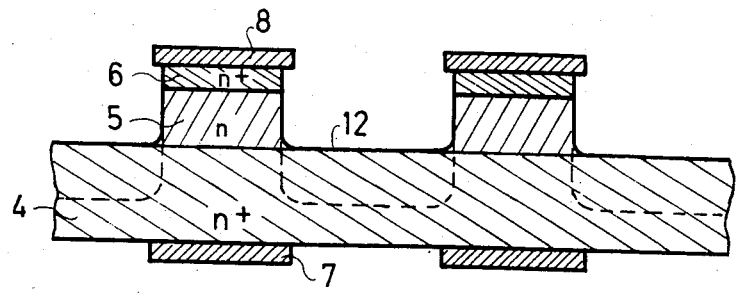
FIGS. 5 to 8 different stages in the production of a submicron vertical field effect transistor according to the invention.

In a first stage shown in FIG. 5, a mesa structure is formed on a type n+ doped material substrate. The latter is preferably of type n+ because it is not possible to produce ballistic or quasi-ballistic ultra-high frequency transistors with type p materials. Moreover, and as has already been stated, the substrate is made from a material such as GaAs, GaAlAs, InP, GaInP, etc. Using known means, on substrate 4 is firstly deposited a type n material layer 5 and a type n+ material film 6 forming a heterojunction. The thickness of layers 5 and 6 is in all cases equal to or less than 1 micron, taking account of that part of layer 5 extending around the mesa face. The source and drain metallizations or metal films 7, 8 respectively are then formed and an implantation produces semi-insulating zones 12 around the mesa base.

Figure 6:
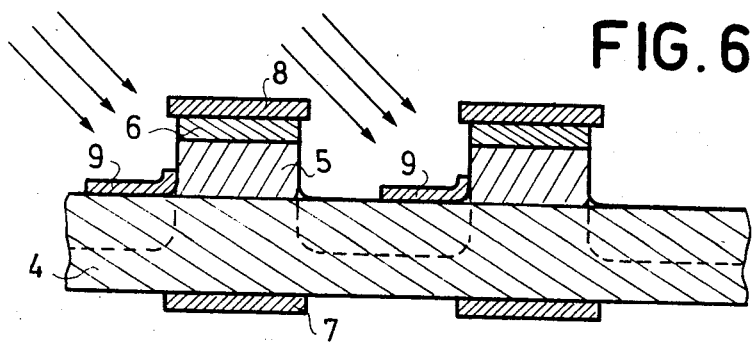

The following stage shown in FIG. 6 consists of depositing the first gate G1 designated 9 by a metal film, which is carried out by a directional source, inclined from one side relative to the transistor structure. This metal film is symbolically represented by arrows coming from the left in FIG. 6.

Figure 7:
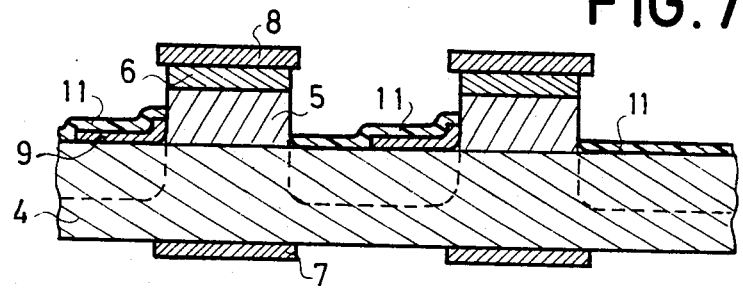

When the first gates G1 or 9 have been formed, the following operation shown in FIG. 7 consists of depositing an insulating layer 11 in the grooves or depressions separating the different mesas of the wafer during production. Thus, and as is obvious to the Expert, such transistors are produced by collective processes and FIGS. 5 to 8 show a fragment of a wafer in which are simultaneously formed a large number of transistors and it is for this reason that there is a depression between two mesas. The nature of insulator 11 depends on the characteristics sought for the transistor and also depends on the starting materials and the conditions under which an insulating layer can be deposited on their surface without destroying the crystal lattice. This insulator can be formed from silicon nitride or other materials.

Figure 8:
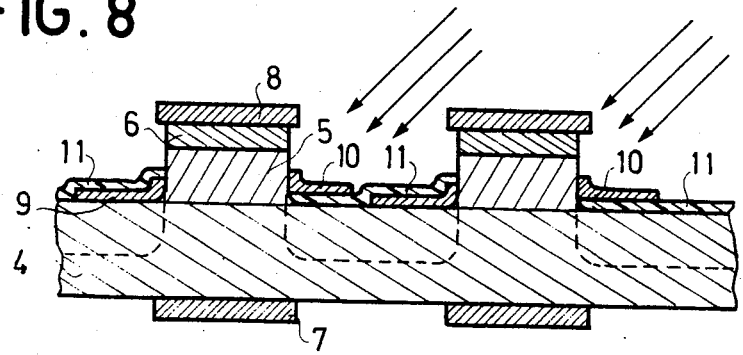

Finally, in FIG. 8, the second gate G2 designated 10 is formed by a second oriented metallization using the same procedure as that for depositing the first gate G1 in FIG. 6. However, on this occasion, the orientation is directed towards the mesa side opposite to that which has received the first gate G1. In FIG. 8, this directed metallization is symbolized by the arrows coming from the right.

Thus, each transistor has received two metallizations G1, 9; G2, 10, and it is obvious that the second gate G2 is supported by an insulating layer 11 is staggered relative to the first gate G1 and that said second gate is nearer to the drain than the first gate G1.

At this production stage, if the transistor is produced in the form of a discrete element, the wafer is cut by passing into depressions between two mesas and the transistor is connected with electrical connections on its four electrodes, i.e. source, drain and two gates G1 and G2. If the transistor forms part of an integrated circuit, it is obvious that transistor cutting does not take place at this time.

The transistor according to the invention can also have a second MIS gate, although it is not shown in FIGS. 5 to 8. In order to produce a MIS transistor, it is merely necessary after the stage of FIG. 6 to deposit a layer of an insulating material on the sides of the mesa and on the bottom of the depression or groove between two mesas and the second gate G2 is deposited on said layer. The important thing is that the sides of the mesa receive the insulating or oxide layer, because the conductor channel develops within the mesa and not flat and parallel to the substrate, on the lateral edges of the transistor. Several combinations are possible between two MES gates; two MIS gates; and a MES gate and a MIS gate.

Obviously, although the invention has been described in connection with the case of a transistor having only one channel layer between one drain electrode and a substrate, as is always necessary, the invention can also apply to more complex transistors, which would have more layers of materials, such as smoothing layers, acceleration layers containing hot electrons, or more complex materials than those described hereinbefore. However, it is obvious that this transistor relates to fast materials, because its operating frequency is in a range up to 200 GHz.

What is claimed is:

1. A field effect transistor with a submicron vertical structure comprising:
   a substrate having a first and second face;
   a source electrode metalization on said first face of said substrate;
   an active layer formed of a semiconductor material on said second face of said substrate;
   a contact layer supported on said active layer formed of a semiconductor material layer;
   a drain electrode metalization supported by said contact layer;
   a mesa structure etched beneath the drain electrode in the active and contact layer semiconductor layers and cuts at least partly into the active layer, wherein the length of the conductor channel in the active layer is less than 1 micron and wherein two gate electrode metalizations constituting a first and a second gate electrode metalization, are deposited on two opposite sides of the mesa structure and which are arranged in a displaced manner, with the second gate electrode metalization being displaced with respect to the first gate electrode metalization by a layer of insulating material deposited on the upper surface of the active layer freed by the formation of the mesa, the second gate increasing the output impedance of the transistor being closer to the drain than the first control gate.

2. A field effect transistor according to claim 1 wherein the metallization of the first gate, deposited on one side of the mesa, is extended on the upper surface of the active layer freed by the formation of the mesa and wherein the metallization of the second gate deposited on the opposite side of the mesa is extended on the surface of a layer of insulating material, which is itself deposited on the upper surface of the active layer, the thickness of said insulating layer producing the displacement between the two gates.

3. A field effect transistor according to claim 1, wherein the substrate and the contact layer are made from a type n+ doped semiconductor material and the active layer is made from a type n doped semiconductor material.

4. A field effect transistor according to claim 1, wherein the semiconductor material of the substrate, as well as the active and contact layers is from group III-V, such as GaAs, $Al_xGa_{1-x}As$, InP, GaInP, etc.

5. Field effect transistor according to claim 1, wherein the semiconductor material of the active layer is made semi-insulating around the mesa by implantation.

6. A field effect transistor according to claim 1 of the MOSFET or MISFET type, wherein an insulating material layer (MIS) or oxide material layer (MOS) is previously deposited on the sides of the mesa, prior to the deposition of the metallizations of the gates.

* * * * *